United States Patent [19]
Takahashi et al.

[11] Patent Number: 5,892,573
[45] Date of Patent: Apr. 6, 1999

[54] EXPOSURE APPARATUS AND METHOD WITH MULTIPLE LIGHT RECEIVING MEANS

[75] Inventors: Kazuhiro Takahashi; Takahisa Shiozawa, both of Utsunomiya, Japan

[73] Assignee: Canon Kabushiki Kaisha, Tokyo, Japan

[21] Appl. No.: 724,527

[22] Filed: Sep. 30, 1996

[30] Foreign Application Priority Data

Sep. 29, 1995 [JP] Japan ..................................... 7-252836
Oct. 16, 1995 [JP] Japan ..................................... 7-267028

[51] Int. Cl.$^6$ .......................... G03B 27/42; G03B 27/52; G03B 27/54; G03B 27/72
[52] U.S. Cl. ............................... 355/69; 355/53; 355/55; 355/67
[58] Field of Search .................................. 355/50, 55, 53, 355/68, 69, 77

[56] References Cited

U.S. PATENT DOCUMENTS

| | | |
|---|---|---|
| 3,823,318 | 7/1974 | Krause . |
| 4,519,692 | 5/1985 | Michalik . |
| 4,595,282 | 6/1986 | Takahashi . |
| 4,617,469 | 10/1986 | Takahashi et al. . |
| 4,711,568 | 12/1987 | Torigoe et al. . |
| 4,804,978 | 2/1989 | Tracy . |
| 4,822,975 | 4/1989 | Torigoe . |
| 4,825,247 | 4/1989 | Kemi et al. . |
| 4,874,954 | 10/1989 | Takahashi et al. . |
| 4,884,101 | 11/1989 | Tanimoto . |
| 4,947,047 | 8/1990 | Muraki . |
| 4,970,546 | 11/1990 | Suzuki et al. . |
| 4,974,919 | 12/1990 | Muraki et al. . |
| 5,053,614 | 10/1991 | Yui et al. . |
| 5,107,275 | 4/1992 | Tsuruoka et al. . |
| 5,119,390 | 6/1992 | Ohmori . |
| 5,121,160 | 6/1992 | Sano et al. . |
| 5,160,962 | 11/1992 | Miura et al. ............................... 355/53 |
| 5,171,965 | 12/1992 | Suzuki et al. . |
| 5,191,374 | 3/1993 | Hazama et al. . |
| 5,250,797 | 10/1993 | Sano et al. . |
| 5,309,198 | 5/1994 | Nakagawa . |
| 5,345,292 | 9/1994 | Shiozawa et al. . |
| 5,365,342 | 11/1994 | Ayata et al. . |
| 5,459,547 | 10/1995 | Shiozawa . |
| 5,475,491 | 12/1995 | Shiozawa . |
| 5,491,534 | 2/1996 | Shiozawa . |
| 5,526,093 | 6/1996 | Takahashi . |
| 5,581,324 | 12/1996 | Miyai et al. ............................... 355/53 |
| 5,661,546 | 8/1997 | Taniguchi .................................. 355/53 |

FOREIGN PATENT DOCUMENTS

| | | |
|---|---|---|
| 61-97830 | 5/1986 | Japan . |
| 4-69660 | 3/1992 | Japan . |
| 5-62876 | 3/1993 | Japan . |
| 6-119971 | 4/1994 | Japan . |

*Primary Examiner*—Richard Moses
*Assistant Examiner*—Shival Virmani
*Attorney, Agent, or Firm*—Fitzpatrick, Cella, Harper & Scinto

[57] ABSTRACT

An exposure apparatus including an illumination optical system, a first light receiving system for receiving a portion of exposure light from the illumination optical system, a movable reticle stage having a transmitting portion for transmitting exposure light, and a second light receiving system for receiving the exposure light transmitted through the transmitting portion. Accordingly, the exposure apparatus is able to correct the sensitivity of the first light receiving system without unloading a reticle.

22 Claims, 12 Drawing Sheets

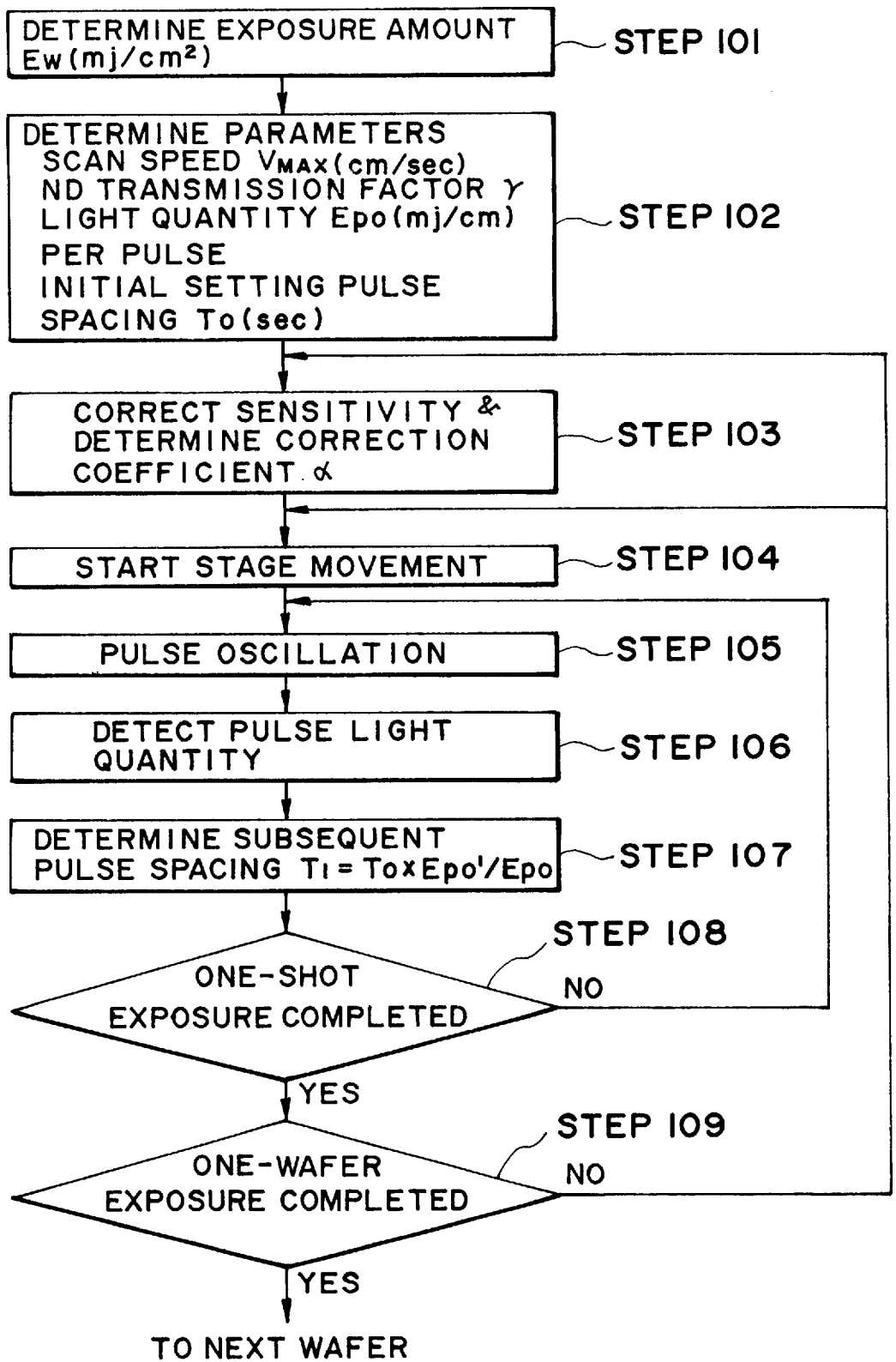
F I G. 5

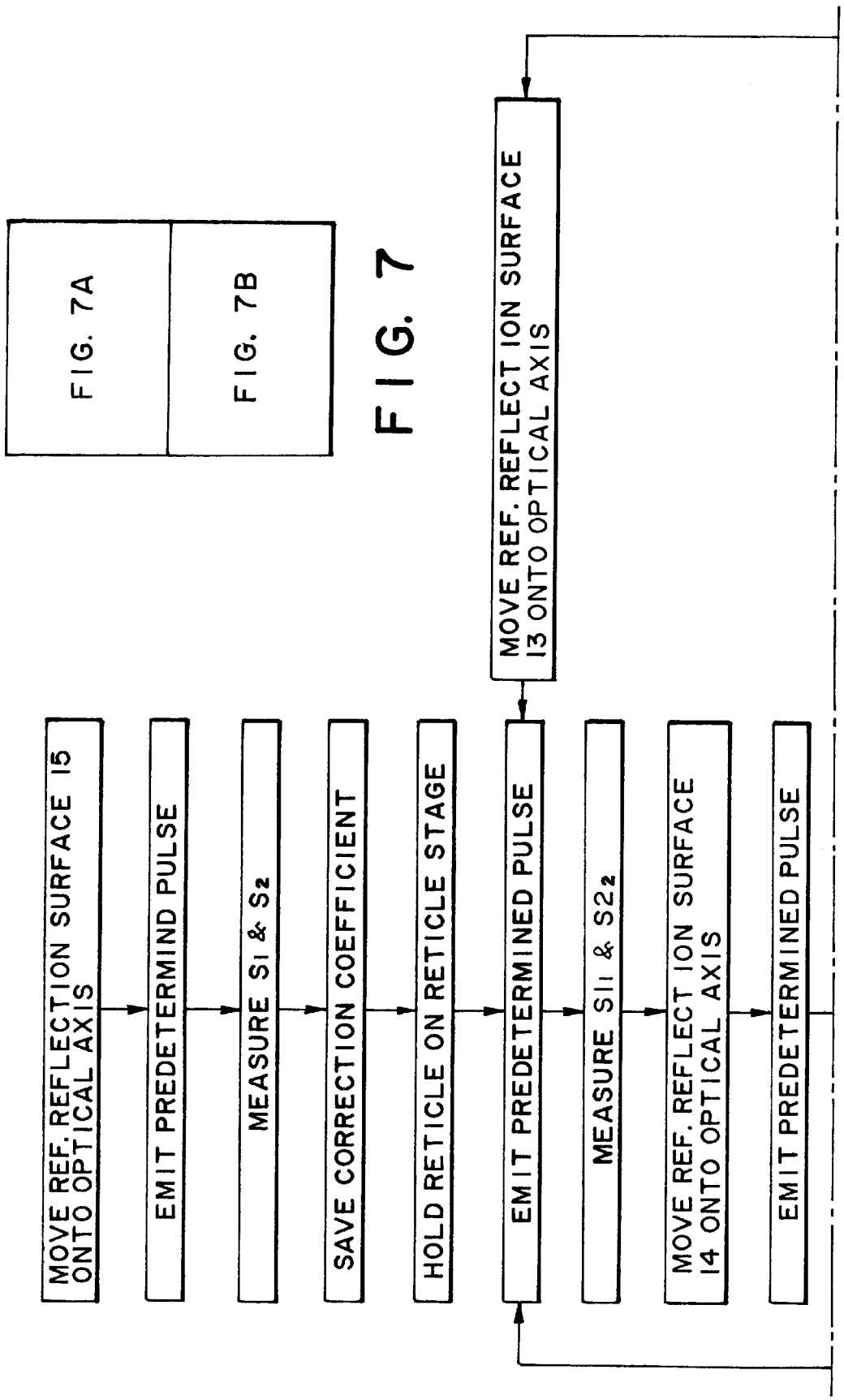

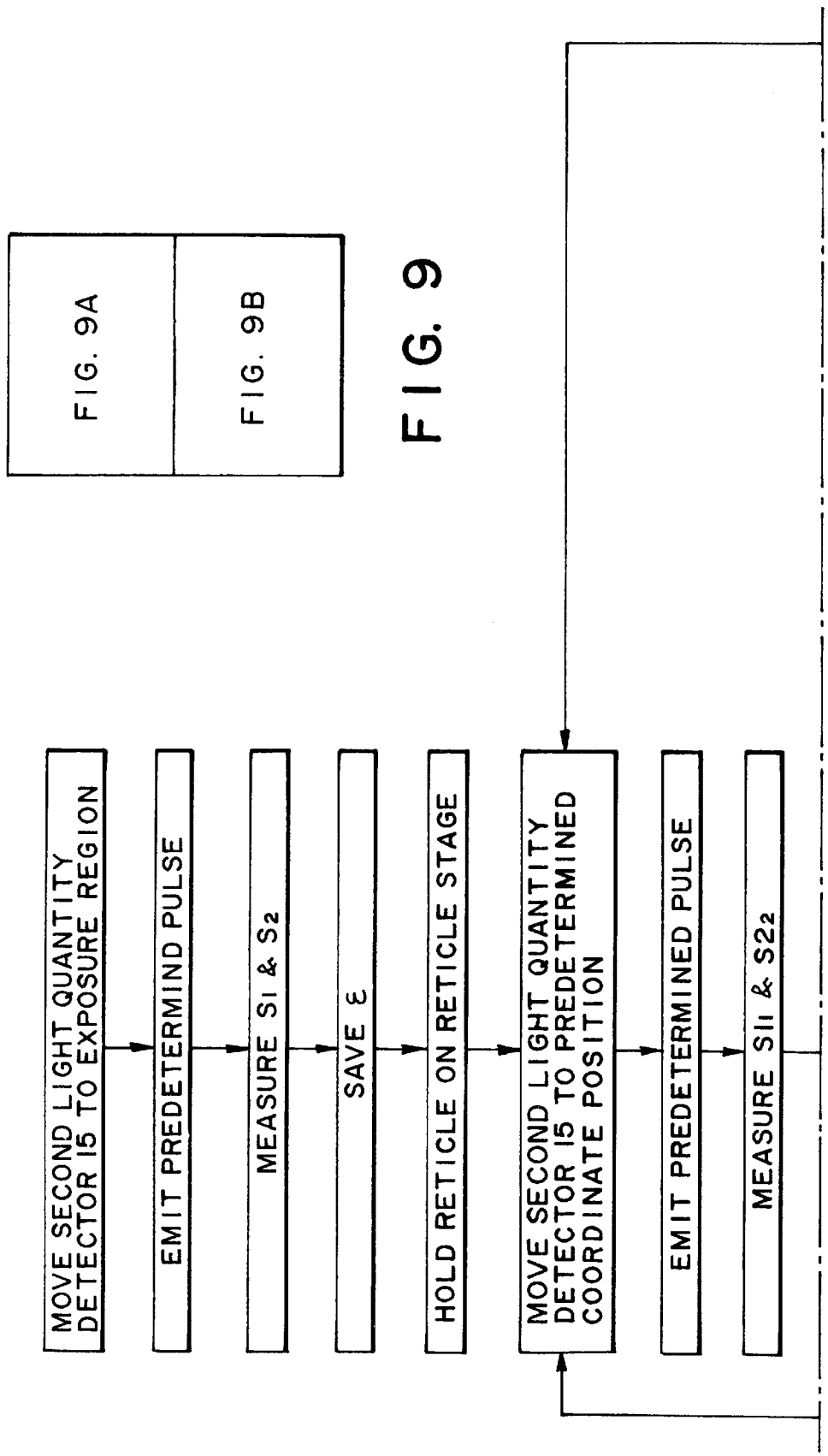

EXPOSURE APPARATUS AND METHOD WITH MULTIPLE LIGHT RECEIVING MEANS

FIELD OF THE INVENTION AND RELATED ART

This invention relates to an exposure method to be used in a lithographic process which is one of the processes for the manufacture of semiconductor devices such as ICs or LSIs, image pickup devices, such as CCDs, and display devices such as liquid crystal panels, or devices such as magnetic heads, for example.

The manufacture of semiconductor devices such as ICs or LSIs based on lithography, uses an exposure apparatus for printing a pattern of a reticle (mask) upon photosensitive material applied to a wafer (photosensitive substrate), directly or in a predetermined reduction ratio.

Generally, photosensitive material applied to a wafer has a determined correct exposure amount. There are exposure apparatuses in which a half mirror is disposed in an illumination optical system and the quantity of exposure light divided by this half mirror is monitored by means of a light receiving element (first light receiving means). The exposure amount control is then made on the basis of the measurement, to achieve the correct exposure amount.

Excimer lasers providing light in the deep ultraviolet region have been used as a light source of an exposure apparatus to meet further miniaturization of a semiconductor device. It has been confirmed that when an excimer laser is used the optical characteristics of an illumination system, an optical component such as a half mirror, for example, and the coating film varies with time. This may be attributed to a variation in the refractivity of the glass material or coating film due to irradiation with the excimer laser light. If this occurs, the ratio between the quantity of excimer laser light divided by the half mirror and the quantity of excimer laser light impinging on a wafer changes accordingly. Thus, the exposure amount control, when it is based on an assumption that the ratio is constant, may result in the difference between the actual exposure amount and the correct exposure amount going beyond a predetermined tolerance.

There is an exposure method in which, to avoid such problem, a light receiving element (second light receiving means) is disposed adjacent to a wafer and, by using a ratio between an output of the first light receiving means for monitoring the light quantity within the illumination optical system and an output of the second light receiving means, the sensitivity of the first light receiving means during the exposure process is corrected and correct exposure amount is achieved.

For detection of the output ratio of plural light receiving means, however, a reticle (actual reticle) to be practically used for the exposure process has to be replaced by a special reticle having a pattern for sensitivity correction, or the actual reticle has to be demounted. The higher the required measurement precision, the more frequently the sensitivity correction has to be done. This leads to decreased throughput.

SUMMARY OF THE INVENTION

It is an object of the present invention to provide an exposure apparatus by which the sensitivity of the first light receiving means can be corrected while an actual reticle is being loaded.

In accordance with an aspect of the present invention, there is provided an exposure apparatus, comprising: an illumination optical system; first light receiving means for receiving a portion of exposure light from the illumination optical system; a movable reticle stage having a transmitting portion for transmitting exposure light; and second light receiving means for receiving the exposure light transmitted through the transmitting portion.

In accordance with another aspect of the present invention, there is provided an exposure method for use with an exposure apparatus having an illumination optical system, first light receiving means for receiving a portion of exposure light from the illumination optical system, a projection optical system, and second light receiving means for receiving exposure light transmitted through at least a portion of the projection optical system, wherein a reticle is illuminated with the illumination optical system so that a pattern of the reticle is transferred to a wafer, the method comprising the steps of: detecting a first ratio between detected values of the first and second light receiving means in a state in which the reticle is not disposed on a path of exposure light, and a second ratio between detected values of the first and second light receiving means in a state in which the reticle is disposed on the path of exposure light; detecting a third ratio between detected values of the first and second light receiving means in a state, after at least one exposure processes, the reticle is disposed on the path of exposure light; and correcting the sensitivity of the first light receiving means on the basis of the first, second and third ratios.

In accordance with a further aspect of the present invention, there is provided an exposure apparatus, comprising: an illumination optical system; first light receiving means for receiving a portion of exposure light from the illumination optical system; a projection optical system; second light receiving means for receiving exposure light transmitted through at least a portion of the projection optical system; correcting means for correcting the sensitivity of a detected value of the first light receiving means, the correcting means is serviceable (i) to detect a first ratio between detected values of the first and second light receiving means in a state in which the reticle is not disposed on a path of exposure light, (ii) to detect a second ratio between detected values of the first and second light receiving means in a state in which the reticle is disposed on the path of exposure light, (iii) to detect a third ratio between detected values of the first and second light receiving means in a state, after at least one exposure processes, the reticle is disposed on the path of exposure light, and (iv) to correct the sensitivity of the first light receiving means on the basis of the first, second and third ratios.

In accordance with a yet further aspect of the present invention, there is provided a device manufacturing method including transferring a pattern of a reticle onto a wafer, the method comprising the steps of: detecting a light quantity of a portion of exposure light from an illumination optical system, by use of first light detecting means; detecting a light quantity of exposure light passed through a transmitting portion of a movable reticle stage, by use of second light detecting means; and correcting a sensitivity of the first light detecting means, on the basis of detected values of the first and second light receiving means.

In accordance with a still further aspect of the present invention, there is provided a device manufacturing method for use with an exposure apparatus having an illumination optical system, first light receiving means for receiving a portion of exposure light from the illumination optical system, a projection optical system, and second light receiving means for receiving exposure light transmitted through at least a portion of the projection optical system, wherein a reticle is illuminated with the illumination optical system so that a pattern of the reticle is transferred to a wafer, the method comprising the steps of: detecting a first ratio between detected values of the first and second light receiving means in a state in which the reticle is not disposed on a path of exposure light, and a second ratio between detected values of the first and second light receiving means in a state in which the reticle is disposed on the path of exposure light; detecting a third ratio between detected values of the first and second light receiving means in a state, after at least one exposure processes, the reticle is disposed on the path of exposure light; and correcting the sensitivity of the first light receiving means on the basis of the first, second and third ratios.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a flow chart for explaining an example of exposure amount control in the exposure apparatus of FIG. 1.

DESCRIPTION OF THE PREFERRED EMBODIMENTS

Figure 1:
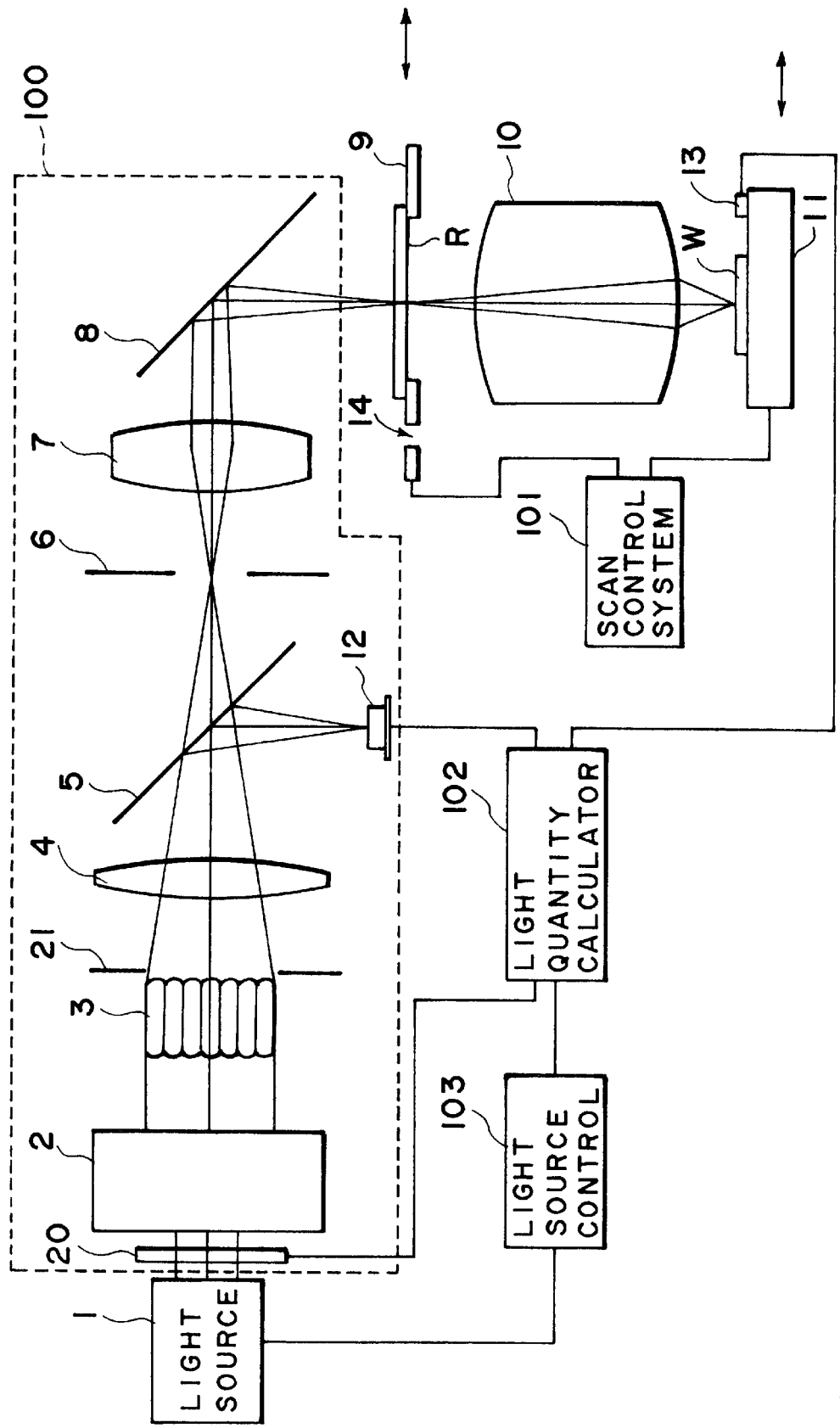
FIG. 1 is a schematic and diagrammatic view of an exposure apparatus according to an embodiment of the present invention.

FIG. 1 is a schematic view of an embodiment of the present invention, which is applied to scan type projection exposure apparatus for use in the manufacture of semiconductor devices, such as ICs or LSIs, liquid crystal devices, and image pickup devices such as CCDs, or devices such as magnetic heads, for example.

In FIG. 1, light from a light source 1 which comprises a high-pressure Hg lamp or an excimer laser, for example, passes a transmissivity adjusting ND filter 20 having a predetermined transmissivity, and then it is shaped by a beam shaping optical system 2 into a desired shape. The light is then directed to a light entrance surface of an optical integrator 3, which comprises a fly's-eye lens, for example. The fly's eye lens comprises a combination of small lenses, and it defines plural secondary light sources in the vicinity of a light exit surface thereof. Denoted at 21 is an aperture stop for determining the size or shape of the secondary light sources. When σ value of illumination is to be changed or oblique illumination is to be performed, this aperture stop 21 is replaced by another. Denoted at 4 is a condenser lens which serves to provide Koehler illumination of a masking blade 6 with light from the secondary light sources of the optical integrator 3. The masking blade and a reticle R are disposed at positions optically conjugate with each other (or slightly deviated from that relation) with respect to an imaging lens 7 and a mirror 8. By determining the shape of the opening of the masking blade 6, the shape and size of illumination region upon the reticle R are determined. The elements as enclosed by a broken line in the drawing are components of an illumination optical system 100. The reticle R is held by a reticle stage 9 by attraction, and they are scanned in a direction of an arrow in FIG. 1. The reticle stage 9 is formed with a light transmitting portion 14 for transmitting exposure light therethrough. Normally, the illumination region upon the reticle R has a slit-like oblong shape with its widthwise direction extending along the scan direction in FIG. 1. Denoted at 10 is a projection optical system for projecting, in a reduced scale, a circuit pattern formed on the reticle R on to a wafer W which is coated with a photosensitive material. Denoted at 11 is a wafer stage on which the wafer is placed. It is scanned in a direction of an arrow in FIG. 1. Also, it is moved in a direction perpendicular to the sheet of the drawing, by which an image of the circuit pattern of the reticle R is printed on different exposure zones on the wafer W. Denoted at 101 is a scan control system cooperable with a driving mechanism (not shown) to scanningly move the reticle stage 9 and the wafer stage 11 at the same ratio as the projection magnification of the projection optical system 10 and exactly at constant speeds.

Denoted at 12 is a first light quantity detector for light quantity monitor. A portion of illumination light from the condenser lens 4 is divided by a half mirror 5, and the detector 12 monitors the thus divided light to thereby indirectly monitor the exposure amount to be applied to the wafer W. Mounted in the vicinity of the wafer W placed on the wafer stage 11 is a second light quantity detector 13 having a light receiving surface being adjusted to be placed at a level substantially the same as that of the wafer W. Thus, the detector 13 can detect the light quantity upon a plane equivalent to the wafer W surface. The first light quantity detector 12 is disposed in an optically conjugate relation with the masking blade 6 with respect to the condenser lens 4 and the half mirror 5, and also it is disposed in a similar relation with the surface of the wafer W to be exposed, i.e., the light receiving surface of the second light quantity detector 13. Denoted at 102 is light quantity calculating means for processing a signal from the first light quantity detector 12 to determine output energy of the light source 1, to provide an appropriate light quantity. Light source control system 103 controls the output energy of the light source 1, in response to a signal from the light quantity calculating means 102.

Figure 2:
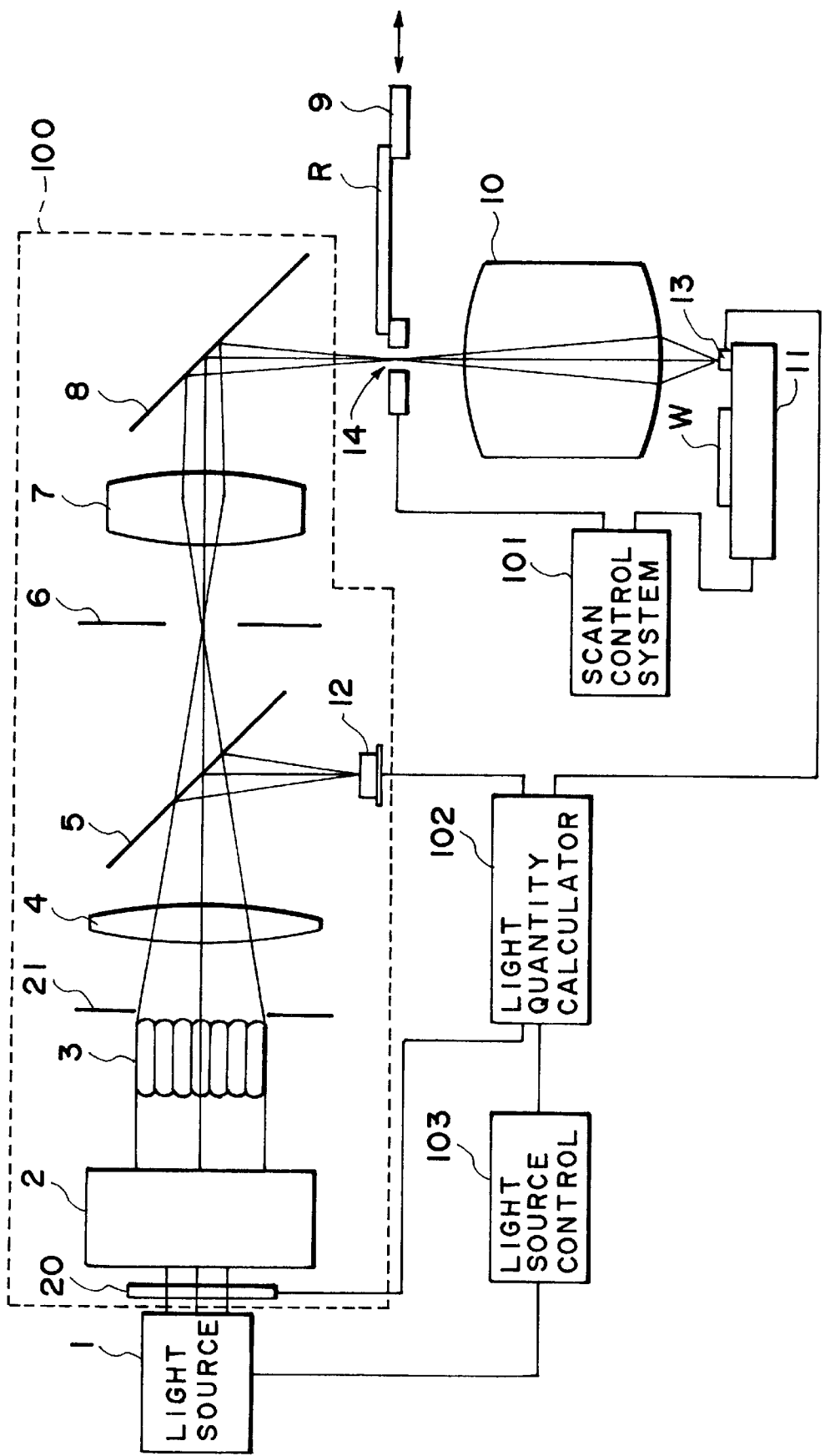
FIG. 2 is a schematic and diagrammatic view of an embodiment of the present invention, for explaining the positional relation when sensitivity correction is to be performed.

FIG. 2 is a schematic view of the whole arrangement, showing the positional relation of the reticle stage 9, the transmitting portion 14 and the second light quantity detector 13 as sensitivity correction of first and second light quantity detectors 12 and 13 is to be executed. The reticle stage 9 is moved by a driving mechanism (not shown) so that the transmitting portion 14 is placed on the optical axis of the projection optical system 10. Similarly, the wafer stage 11 is moved by a driving mechanism (not shown) so that the second light quantity detector 13 is placed on the optical axis.

Figure 3:
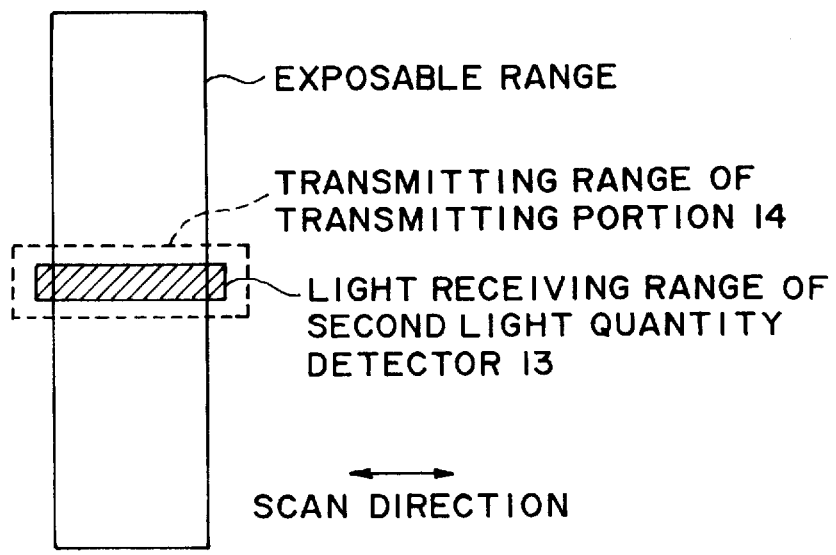
FIG. 3 is a schematic view for explaining the relation between a second light quantity detector, a transmitting portion and an exposable range.

FIG. 3 illustrates the relation between the light receiving surface of the second detector 13 and an image of the light transmitting portion 14 of the reticle stage 9, being projected by the projection optical system 10, as the sensitivity correction in FIG. 2 is going to be performed. The range depicted in the drawing by a solid line is an exposable range (illumination region) which can be illuminated by means of the illumination optical system 100 and the projection optical system 10. In scanning exposure apparatus, this exposable range usually has an oblong shape with its widthwise direction extending in the scan direction (arrow), or it may have an arcuate slit-like shape.

The light receiving surface of the second light quantity detector may desirably have a shape which is longer than the exposable range with respect to the scan direction and which is sufficiently shorter than the exposable range with respect to a direction perpendicular to the scan direction. For keeping uniformness of exposure amount over the wafer W surface in scanning exposure, the light quantity accumulated in the scan direction should be constant with respect to the lengthwise direction perpendicular to the scan direction. Thus, while moving the second detector 13 sequentially to different positions along the lengthwise direction, the light quantities at respective positions are measured. By this, integrated illuminance (mW/cm) per unit length along the lengthwise direction of the slit and with respect to the scan direction can be determined. Thus, illuminance distribution along the lengthwise direction can be measured.

In the state described, the light source 1 emits light in response to a signal from the light source control system 103, and the light quantities incident on the first and second detectors 12 and 13, respectively, are measured. Here, a signal obtainable with the first detector 12 is denoted by S1, and a signal with the second detector 13 is denoted by S2. Each of the signals S1 and S2 represents a value corresponding to the light quantity in unit time upon the plane equivalent to the wafer W surface or the light quantity per one pulse where the light source 1 comprises a pulse light source (or a value corresponding to integrated light quantity of every pulses of a predetermined number). At an initial setting (at the start of the operation of the apparatus or periodic maintenance thereof), an absolute illuminomitor may be mounted on the wafer stage 11 to perform light quantity measurement, and sensitivity adjustment (gain adjustment) may be performed to assure the relation $(gS1)_{ini}=(fS2)_{ini}=E$, where E is the light quantity upon the wafer W as measured by the absolute illuminomitor, g and f are gains for conversion of output signals S1 and S2 into light quantities, respectively.

If there is no variation with time in the optical components, the actual light quantity on the wafer surface is equal to gS1. If, however, there occurs a variation with time, actual exposure amount on the wafer differs from gS1. In order to correct light quantity measurement error due to variation with time of the optical components, output signals from the first and second light quantity detectors 12 and 13 are applied to the light quantity calculating means 102 to calculate a correction coefficient a $\alpha=(fS2/gS1)_{cal}$, and gain correction is performed to assure $g=g_{old}\times\alpha$, where $g_{old}$ is the gain before sensitivity adjustment. By doing this, it is enabled to perform correct measurement of the light quantity on the wafer W and, therefore, to perform an exposure process with correct exposure amount.

Figure 4:
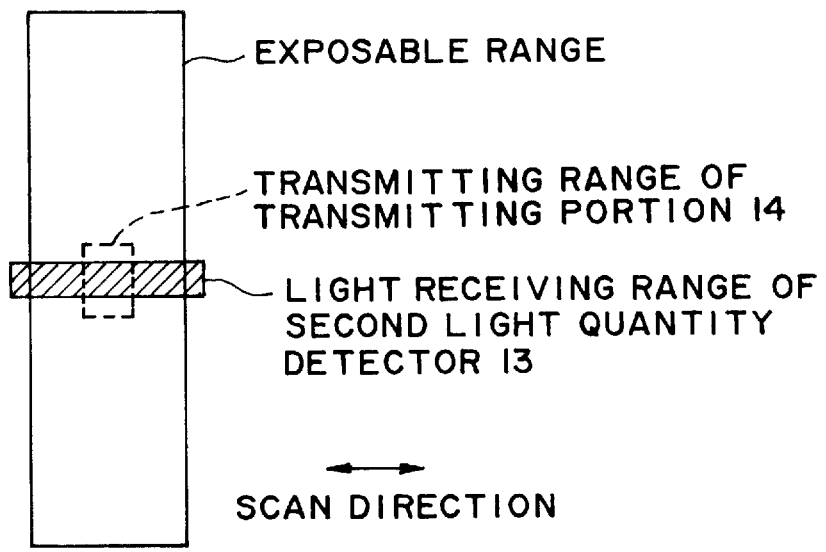
FIG. 4 is a schematic view for explaining a relation between a second light quantity detector, a transmitting portion and an exposable range, in another example.

FIG. 4 shows another example wherein, as compared with that shown in FIG. 3, the light transmitting portion 14 of the reticle stage 9 has a different shape and wherein the image of the transmitting portion 14 as projected by the projection optical system is smaller than the light receiving portion of the second light quantity detector 13.

In this example, the reticle R is first unloaded from the reticle stage 9, and a light quantity signal S2 in the state in which the light receiving portion of the second light quantity detector 13 is not at all blocked as well as a light quantity signal S2' in the state in which it is partially blocked by the transmitting portion 14 such as shown in FIG. 4, are measured. Then, a proportional constant $\beta=(fS2/fS2')_{ini}$ is determined. Since basically this proportional constant is not influenced by a variation with time, it may be sufficient to measure the same only in the initial setting. For sensitivity correction, the second light quantity detector 13 and the transmitting portion 14 are kept in the positional relation shown in FIG. 14, and, in response to light emission of the light source 1, the light quantities incident on the first and second detectors 12 and 13 are measured. If output signals corresponding to these measured light quantities and to be applied to the calculating means 102 are denoted by S1 and S2', respectively, the ratio $\alpha'=\beta\times(fS2'/gS1)_{cal}$ can be calculated. Also in that case, for exposure process, the sensitivity adjustment is made to assure a relation $g=g_{old}\times\alpha'$. By doing it, it is enabled to perform correct measurement of the light quantity on the wafer W surface and therefore to perform exposure process with the correct exposure amount.

While FIG. 2 shows an example wherein the light transmitting portion 14 and the second detector 13 are placed on the optical axis of the projection optical system 10, it is not always necessary that they are on the optical axis provided that there is a positional relation between the image of the transmitting portion 14 and the light receiving portion of the second detector 13 as shown in FIG. 3 or 4.

Also, while the light receiving surface of the second detector 13 shown in FIG. 3 or 4 is longer than the width of the exposable range in the scan direction, if it is shorter than the latter, measurement of illuminance distribution is enabled by moving the wafer stage 11 two-dimensionally. Further, the integrated light quantity in the scan direction can be determined by integrating measurement results with respect to the scan direction.

Next, the light quantity setting in a case where the light source 1 of the scanning projection exposure apparatus of FIG. 1 or 2 comprises a pulse laser.

First, a job for an exposure process is loaded. Here, conditions such as the numerical aperture of the projection optical system 10, the illumination condition (σ value or modified illumination) and the range of masking blade 6, for example, are also loaded. In accordance with the illumination condition loaded, the size or shape of the aperture stop 21 of the illumination optical system 100 is selected, and the masking blade 6 is moved to effect light blocking in an appropriate range. Then, the reticle stage 9 and the wafer stage 11 are moved so that the light transmitting portion 14 and the illuminance monitor 13 are placed on the optical axis of the projection optical system 10 as shown in FIG. 2. The light source control system 103 causes the light source 1 to emit light, with a set voltage $V_0$. By using output signals S0 and S2 produced in response by the first and second light quantity detectors 12 and 13, respectively, the calculating means 102 calculates a sensitivity correction coefficient a $\alpha=(fS2/gS1)_{ini}$.

Here, as regards the maximum stage scan speed $V_{MAX}$ (cm/sec), a slower one of the mechanical highest speed for precise stage control and the highest speed calculated from a minimum pulse number necessary for scan exposure, may be selected. If the exposure amount per unit area to be supplied to the wafer W is $E_W$ (mJ/cm$^2$), the pulse emission frequency of the light source 1 is f (Hz), and the projected light quantity on the wafer W per pulse in the scan direction is Ep (mJ/cm), then the scan speed V of the wafer stage 11 is V=Ep×f/$E_W$ (cm/sec).

If V<$V_{MAX}$, under the control of the scan control system 101, the wafer stage 11 is constant-speed scanned at the scan speed V while the reticle stage 9 is constant-speed scanned at a scan speed multiplied by the ratio of projection magnification of the projection optical system 10, by which the exposure is effected. As regards the exposure amount control, the light source control system 103 operates to assure that the light quantity per pulse as detected by the first light detector 12 becomes equal to Ep. In actual exposure process, the output energy of each pulse of the light source 1 has a variation within a certain range. Thus, there occurs a variation in the light quantity on the wafer W, with irradiation with pulses. As regards the compensation for the variation in the pulses, there is a known method in which a target value of the pulse to be emitted is adjusted in accordance with the light quantity of past pulse light.

If V>$V_{MAX}$, it is necessary to reduce the irradiation light quantity per pulse. As for a reduction of the irradiation light quantity, for example, there are a method in which the irradiation light quantity (=$E_{p-1}$−$V_{MAX}$×$E_W$/f) per pulse is calculated by the calculating means 102 and the set voltage is lowered by the light quantity control system 103 so that the irradiation light quantity becomes equal to $E_{p-1}$, and a method in which an ND filter 20 having an appropriate transmissivity is inserted into the light path of the illumination optical system 100. Optimum transmissivity of the ND filter 20 can be calculated by the light quantity calculating means 102. If the transmissivity of ND filter 20 is $\gamma$, a filter having the highest transmissivity in a range satisfying a relation $\gamma$<$V_{MAX}$×$E_W$/f/Ep may be selected. As regards the selection of ND filter 20, for example, there are a method in which optimum one of filters mounted in a turret is chosen, and a method in which plural ND filters are used in combination.

Further, if $E_W$<$Ep_{MAX}$×f/$V_{MAX}$, taking into account the throughput, it is desirable to use both of the method in which the set voltage of the light source 1 is changed to adjust the pulse energy and the method in which the pulse energy is adjusted by using an ND filter, in combination, so that the scan is performed constantly at speed $V_{MAX}$. If the range of the light quantity Ep upon the wafer W which can be adjusted in the limits of voltage that can be set by the light source control system 103 is $Ep_{MAX}$>Ep>$Ep_{MIN}$ (mJ/cm), a desired light quantity is achieved by setting a filter of transmissivity $\gamma$ that satisfy a relation $Ep_{MAX}$>$V_{MAX}$×$E_W$/f/ $\gamma$>$Ep_{MIN}$. As regards the transmissivity of the ND filter 20, it may be sufficient to prepare those with differences narrower than $(Ep_{MIN}/Ep_{MAX})^N$ (N is an integer) to a lowest 5%–10%.

Referring next to FIG. 5, an example of exposure amount control based on control of pulse emission timing in a scan type exposure apparatus, will be explained.

When the exposure amount $E_W$ (mJ/cm$^2$) of the wafer W is set (step 101) and if $E_W$<$Ep_{MAX}$×f/$V_{MAX}$, then the scan speed $V_{MAX}$ (cm/sec), the transmissivity $\gamma$ of the ND filter 20 and the irradiation light quantity $Ep_0$ (mJ/cm) on the wafer W per pulse are determined (step 102). If the sensitivity correction coefficient as calculated by the light quantity calculating means 102 is $\alpha$, the gain to the output signal of the first light quantity detector 12 is g=$g_{old}$×$\alpha$ (step 103). Subsequently, movement of the reticle stage 9 and the wafer stage 11 is initiated moved from predetermined positions (step 104). Before the pattern of the reticle R reaches the exposure region by the illumination system 100, the light source control system 103 causes the light source 1 to emit light (step 105), and a designation signal of the control system 103 is adjusted to assure an irradiation light quantity equal to $Ep_0$.

After the reticle stage 9 and the wafer stage 11 reach their constant speeds and when the exposure of the wafer W starts, the first light quantity detector 12 is used to measure the light quantity per pulse (step 106) and to detect a difference with respect to a target value. From the result, the calculating means 102 calculates pulse emission interval (spacing) of the light source 1, and the control system 103 controls the emission timing of the light source 1. If the initially set pulse emission frequency is $f_0$, the pulse interval as initially set is $T_0$=1/$f_0$ (sec). If the light quantity as measured by the first detector 12 is $Ep_0$' the target value $Ep_0$, the interval $T_i$ to the subsequent pulse emission is $T_i$=$T_0$× $Ep_0$'/$Ep_0$. Thus, a pulse is emitted with the lapse of $T_i$ (sec). The above-described control is repeated for subsequent pulses (steps 108 and 109).

In addition to the example of FIG. 5, there is an alternative method of exposure amount control based on pulse emission timing control, in which the position of the wafer stage 11 is monitored. More specifically, if the initially set pulse oscillation frequency is $f_0$ and the scan speed is $V_{MAX}$, then the movement amount $X_0$ of the wafer stage 11 that provides a reference is $X_0$=$V_{MAX}$/$f_0$ (cm). If a detection signal corresponding to the light quantity measured at the first detector 12 is $Ep_0$" to the target value $Ep_0$, the calculating means 102 calculates the movement amount $X_i$ up to the subsequent pulse emission. At the moment, as the wafer stage 11 moves by $X_i$, the subsequent pulse is emitted. Here, there is a relation $X_i$=$X_0$×$Ep_0$"/$Ep_0$.

In FIG. 5, the timing of sensitivity correction based on the first and second detectors 12 and 13 may be set as desired, for example, per wafer or per every wafers of a number N.

While in the above-described embodiments the invention has been described with reference to a scan type exposure apparatus, similar advantageous effects are attainable when the invention is applied to a step-and-repeat type projection exposure apparatus (stepper), or a contact type or proximity type exposure apparatus.

Figure 6:
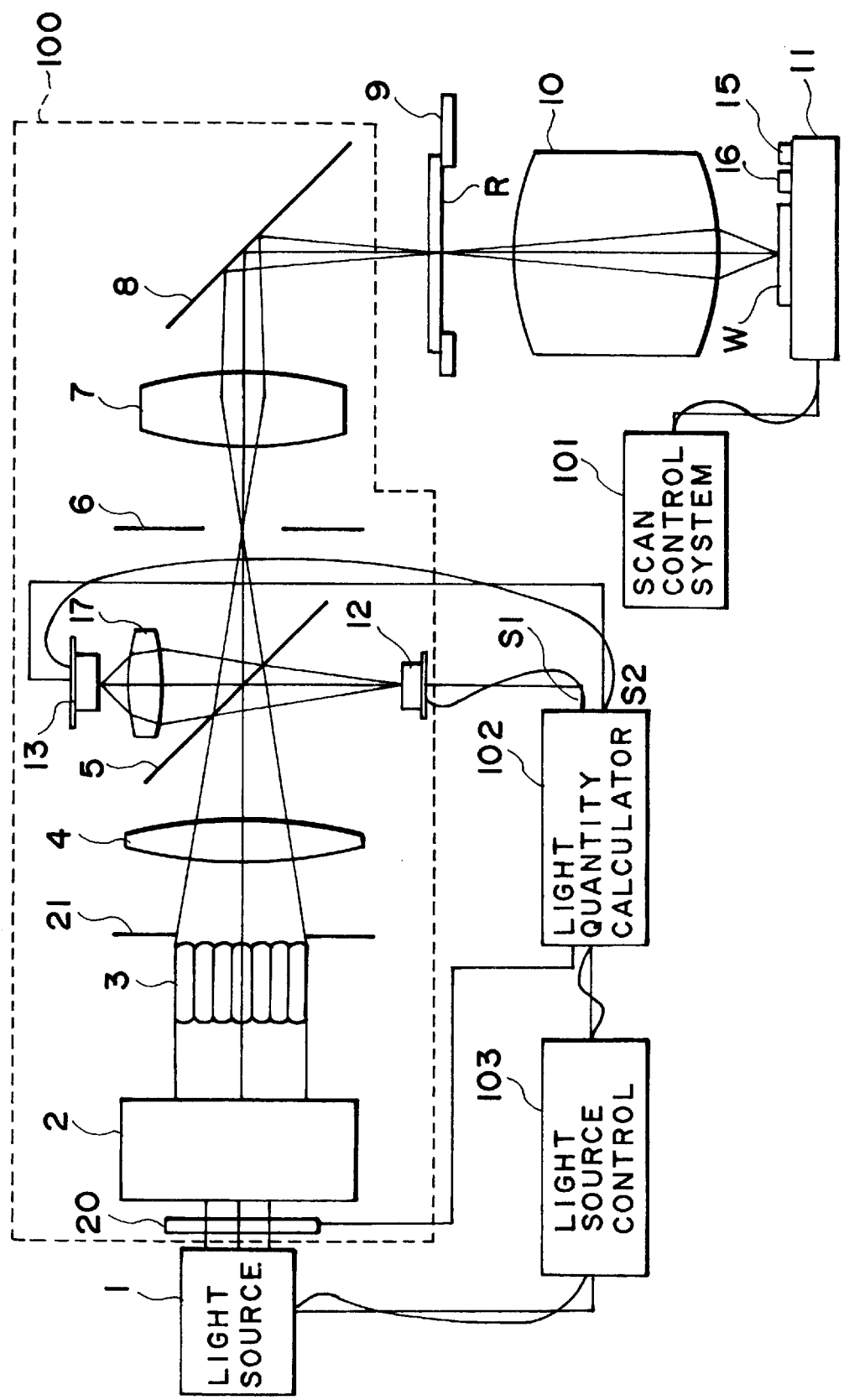
FIG. 6 is a schematic and diagrammatic view of an exposure apparatus according to another embodiment of the present invention.

FIG. 6 is a schematic view of an exposure apparatus according to another embodiment of the present invention. The components shown in FIG. 6 have basically the same functions as of those shown in FIG. 1 with like numerals, but the exposure apparatus of FIG. 6 is a stepper whereas that of FIG. 1 is a scanning exposure apparatus. Thus, the reticle stage 9 of FIG. 6 is held stationary during the exposure process. The following description will be made mainly on those components not included in the FIG. 1 embodiment.

Mounted in the vicinity of the wafer W on the wafer stage 11 are reference reflection surfaces 15 and 16 having an adjusted level substantially the same as of the wafer W. The reflection surface 15 has a predetermined reflectivity to exposure light, while the reflection surface 16 has zero reflectivity to the exposure light. Light reflected by the reference reflection surface 15 goes back to the illumination optical system 100 via the projection optical system 10 and the reticle R. A portion of this light is reflected by a half mirror 5 of the illumination optical system 100, and it is collected by a condensing lens 17 and is projected on the second light quantity detector 13. The light entrance surface of the second light quantity detector 13 is disposed at a position optically conjugate with the masking blade 6 with respect to the condensing lens 17, and thus it is also in an optical conjugate relation with the circuit pattern surface of the reticle R or with the wafer W surface.

The light source 1 comprises a high-pressure Hg lamp or an excimer laser, for example. In the following description, a case where an excimer laser is used as the light source 1 will be explained. Generally, when an excimer laser is used as a light source of an exposure apparatus, an exposure region of one shot is exposed with the use of light pulses having a variation in light quantity.

Next, referring to the flow charts of FIGS. 7A and 7B, the procedure of supplying correct exposure amount in the projection exposure apparatus of FIG. 6, based on the sensitivity correction of the first light quantity detector 12, will be explained.

First, at initial setting (at start of operation of the apparatus or at periodic maintenance thereof), an absolute illuminomitor (not shown) is mounted on the wafer stage 11 and, in response to emission of pulses of a predetermined number from the light source 1 responsive to a signal from the light source control system 103, an output signal of the first light quantity detector 12 are measured. The output signal S1 of the first detector 12 are at this moment represents a value corresponding to the light quantity E (mJ/cm$^2$/pulse) upon the wafer W surface as measured through the absolute illuminomitor, and it is given by E=gS1. Subsequently, the reference reflection surface 13 having a predetermined reflectivity is moved into an exposure region of the projection optical system 10 and, by using the output signal S2 of the second light quantity detector 13, sensitivity adjustment (gain adjustment) is performed to achieve gS1= fS2 (=E), where g and f are gains for converting the output signals S1 and S2, respectively, into light quantities on the wafer W surface. At that time, the exposure amount supplied to the wafer W can be measured correctly by means of the first detector 12, and correct exposure control is attainable.

If however the transmissivity of optical components varies due to irradiation with exposure light from the light source, it results in a difference between the actual light quantity on the wafer W and the light quantity as predicted from the output signal S1 of the first detector 12. In this embodiment, sensitivity correction to the first detector 12 is performed on the basis of a (i) first sensitivity correction step (first step) which is executed preparatorily in a state in which the reticle R is not loaded and in a stage in which it is being loaded, and (ii) a second sensitivity correction step (second step) which is executed, while the reticle R is being held, when, after exposure processes of a predetermined number are performed, the variation of optical components with time, following execution of the first sensitivity correction step, might have occurred.

The first step will be explained below. The wafer stage 11 moves so that the reference reflection surface 15 having a predetermined reflectivity comes to the exposure region of the projection optical system 10 and, thereafter, the light source 1 emits light in response to a signal from the control system 103. Output signals S1 and S2 of the first and second detectors 12 and 13, per pulse, are applied to the light quantity calculating means 102 by which the light quantity on the wafer W surface is calculated. Here, if gS1≠fS2, it is concluded that the transmissivity of the illumination optical system 100 or the projection optical system 10 has varied with time. Thus, the calculating means 102 performs sensitivity correction calculation on the basis of the output signals S1 and S2. If the transmissivity of the portion of the illumination optical system 100 at the half mirror 5 and following it is $T_I$, the transmissivity of the projection optical system is $T_p$ and the reflectivity of the reference reflection surface 15 (of predetermined reflectivity) is R, then the output signal S2 of the second detector 13 is given by:

$$S2 \alpha T_I^2 \times T_p^2 \times R \tag{1}$$

and it is proportional to the square of the transmissivity of the illumination optical system 100 and the projection optical system 10. When the transmissivity of the illumination optical system being calibrated during the initial setting by using an absolute illuminomitor is $T_{I0}$, the transmissivity of the projection optical system 10 at that time is $T_{p0}$, and similarly when the transmissivities of the illumination optical system 100 and the projection optical system 10 after a variation with time are $T_{I1}$ and $T_{p1}$, if the ratio of light quantity on the wafer W surface as calculated from the output signals after variation with time is $\gamma^2$=fS2$_1$/gS1$_1$, then it follows from gs1$_1$=fS2$_0$ (S2$_0$ is the output signal of the second detector 13 as no variation has occurred with time) that:

$$\gamma^2 = (T_{I1} \times T_{p1})^2 / (T_{I0} \times T_{p0})^2 \tag{2}$$

Here, $\gamma^2$ corresponds to the square of transmissivity variation of the illumination optical system 100 and the projection optical system 10. In that case, the light quantity E upon the wafer W surface as predicted from the output signal S1 of the first detector 12 is E=γ×gS1. This γ is taken as the sensitivity correction coefficient for the first step, and it is stored into the calculating means 102.

Subsequently, the reticle R is placed on the reticle stage 9 and the reference reflection surface 15, having a reflectivity R, is moved into the exposure region of the projection optical system 10. In this state, the light source 1 is oscillated, and signals S1$_2$ and S2$_2$ of the first and second detectors 12 and 13 are measured. Thereafter, the reference reflection surface 16, having zero reflectivity, is moved similarly into the exposure region of the projection optical system 10, and the light source 1 is oscillated and output signals S1$_3$ and S2$_3$ of the first and second detectors 12 and 13 are measured.

Here, if the proportion of the light quantity as reflected by the material (e.g., Cr) of the circuit pattern of the reticle R and impinging on the second detector 15 is $P_1$, and the proportion of light quantity as transmitted through a transmissive portion of the reticle R, passing through the projection optical system 10, reflected by the reference reflection surface 13, passing again through the projection optical system 10 and the reticle R and impinging on the second detector 15 is $P_2$, it follows that:

$$S2_2 \alpha (T_{I1}^2 \times P_1 + (T_{I1} \times T_{p1})^2 \times P_2 \times R) \tag{3}$$

$$S2_3 \alpha (T_{I1}^2 \times P_1) \tag{4}$$

The difference between S2$_2$ and S2$_3$ determines the output signal corresponding to the light quantity upon the wafer W surface.

$$S2_2 - S2_3 \alpha (T_{I1} \times T_{p1})^2 \times P_2 \times R \tag{5}$$

Equation (5) above provides information proportional to the square of the product of the transmissivities of the illumination optical system 100 and the projection optical system 10. In equation (5), in order to remove the influence of the dispersion of the light quantity in the pulses from the light source 1, the light quantity on the wafer W surface, as calculated from the output signal of the second detector 13, is divided by the light quantity on the wafer W surface as calculated from the output signal of the first detector 12.

$$D = fS2_2/(\gamma \times gS1_2) - fS2_3/(\gamma \times gS1_3) \tag{6}$$

The value D is taken as an initial value $D_0$ for calculation of the sensitivity correction coefficient for the second step, and it is stored into the calculating means 102.

In the first sensitivity correction step described above, sensitivity correction just before start of exposure, as well as calculation of the initial value necessary for the determination of the sensitivity correction coefficient for the second step, are carried out. Next, the second sensitivity correction step to be performed in the course of sequential projection exposures of the circuit pattern of the reticle R will be explained.

With the repetition of exposures, the transmissivity of the illumination optical system 100 or the projection optical system 10 varies. In this embodiment, when the exposure of wafers of a number N is completed, the reference reflection surfaces 15 and 16 are moved again into the exposure region of the projection optical system 10, and the sensitivity correction is performed on the basis of output signals of the first and second detectors 12 and 13. If the transmissivity of the illumination optical system 100 has changed to $T_{I2}$ and that of the projection optical system 10 has changed to $T_{P2}$, it follows that:

$$\delta^2 = D/D_0 = (T_{I2} \times T_{P2})^2/(T_{I1} \times T_{p1})^2 \tag{7}$$

The coefficient $\delta^2$ obtainable from the above equation has a value corresponding to the square of the transmissivity change, and $\delta$ corresponds to the transmissivity change. This $\delta$ is taken as the sensitivity correction coefficient for the second step, and it is stored into the calculating means 102.

While in this embodiment the sensitivity correction at the second step is performed per every wafers of a number N, the sensitivity correction timing may be set for desired wafer numbers. Also, the sensitivity correction may be performed just after an excess of the amount of transmissivity variation over a certain value is predicted. In that case, transmissivity variation measurement is not performed if sensitivity correction is not necessary. Thus, it is effective to reduce the slow down of the throughput.

In the subsequent exposure processes, the light quantity E upon the wafer W surface as predicted from the output signal S1 of the first detector 12 is E=γ×δ×gS1. Here, "γ×δ×g" is the gain to the output signal S1 as newly determined through the sensitivity correction at the second step. Correct measurement of the light quantity on the wafer W and an exposure process with the correct exposure amount are thus enabled.

In a case where the area of the transmissive portion of the circuit pattern of the reticle R is small, such as in the case of a contact hole, the difference between the output signals $S2_2$ and $S2_3$ of the second detector 15 becomes smaller and precision of the coefficient δ calculation become lower. As a result, the measurement precision of the first detector 12 is slowed down. If the reticle R has such a pattern structure, since the light quantity impinging on the projection optical system 10 is notably small, it is possible to consider that the transmissivity change of the projection optical system 10 is small. Thus, for sensitivity correction, it may be sufficient to monitor only the transmissivity variation of the illumination optical system 100. For this reason, the reference reflection surface 16 with zero reflectivity may be moved into the exposure region, and only the signal $S2_2$ of the second detector 13 may be measured. In that case, equations (6) and (7) may be rewritten as follows:

$$D = fS2_2/(\gamma \times gS1_2) \tag{8}$$

If the initial value is $D_0$, $$\delta^2 = D/D_0 = (T_{I2}/T_{I1})^2 \tag{9}$$

Here, δ corresponds to the transmissivity change in the illumination optical system 100 and, therefore, it is stored into the calculating means 102 as a sensitivity correction coefficient for the second step.

As regards the position of the second detector 13, in place of the example shown in FIG. 6, it may be disposed at a position optically conjugate with a pupil plane of the projection optical system 10. Further, any other location is possible provided that the information related to transmissivity variation of the illumination optical system 100 or the projection optical system 10 is obtainable. The condensing lens 17 may be omitted if it does not raise a problem of measurement precision.

If the size of the reference reflection surface 15 or 16 is smaller than the exposure range of the circuit pattern of the reticle R, the wafer stage 11 may be step-moved within a range of projection of the circuit pattern of the reticle R and output signals of the second detector 13 corresponding to the positions of the reference reflection surfaces 15 and 16 may be measured. Then, the coordinates of such position whereat the output is highest may be memorized. In the state in which the reticle R is loaded, the reference surfaces 15 and 16 may be moved to those positions, and sensitivity correction may be performed.

Figure 8:
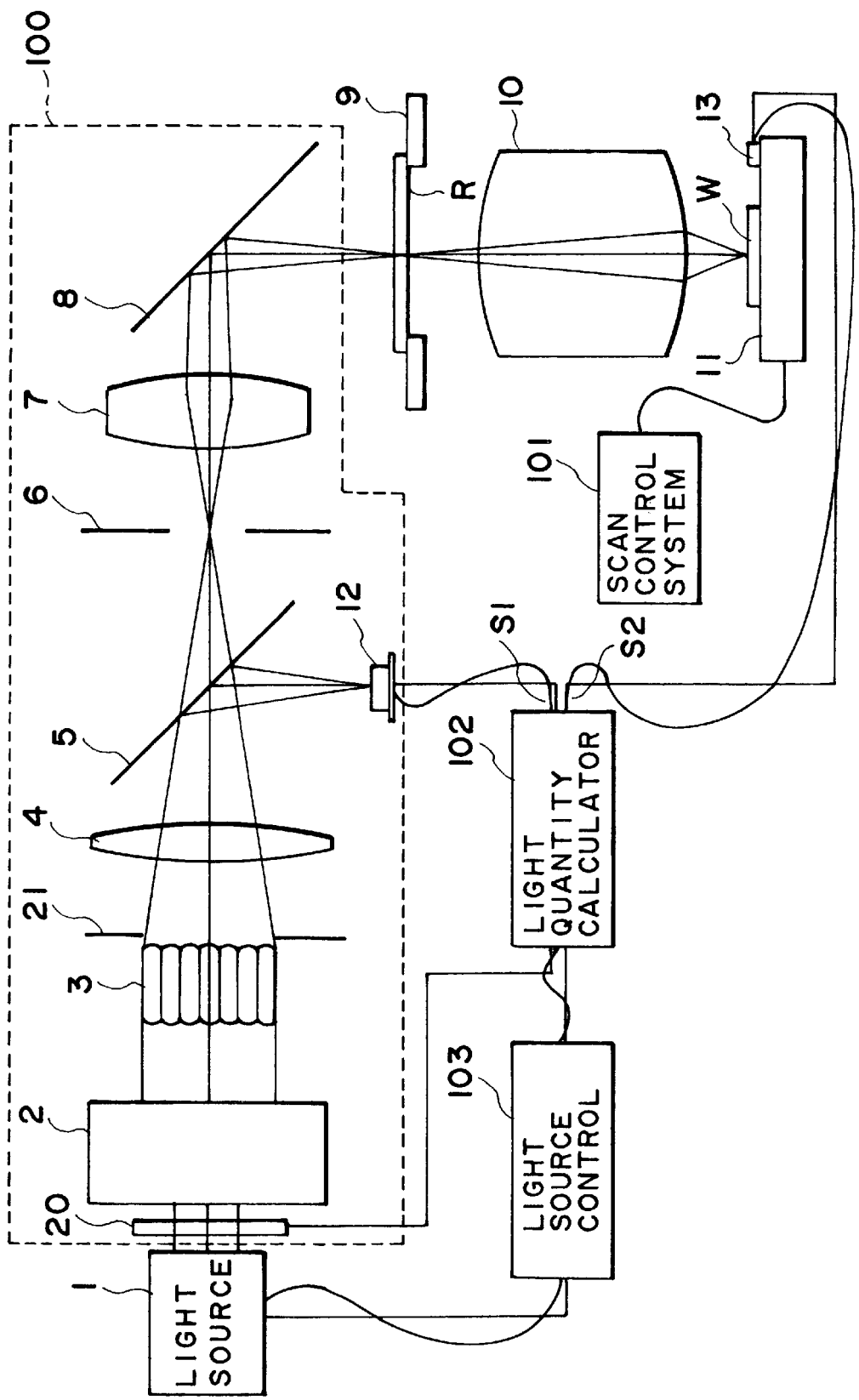
FIG. 8 is a schematic and diagrammatic view of an exposure apparatus according to a further embodiment of the present invention.

FIG. 8 is a schematic view of an exposure apparatus according to a further embodiment of the present invention. A description of this embodiment will be made mainly on the structure of the portion different from the FIG. 6 embodiment.

Mounted in the vicinity of the wafer W on the wafer stage 11 is a second light quantity detector 13 having a light receiving surface whose position with respect to the optical axis direction of the projection optical system 10 is placed at a level substantially equal to that of the wafer W surface. In the initial setting, like the FIG. 6 embodiment, an absolute illuminomitor (not shown) is mounted on the wafer stage 11, and adjustment of output signals of the first and second light quantity detectors 12 and 13 is carried out.

Now, referring to the flow charts of FIGS. 9A and 9B, the sensitivity correction procedure in the projection exposure apparatus of FIG. 8 will be explained.

At the first step, while keeping the reticle R unloaded out of the reticle stage 9, the second detector 13 is moved into the exposure region of the projection optical system 10. In this state, in response to a signal from the light source control system 103, the light source 1 emits pulses of light of a predetermined number. Output signals S1 and S2 of the first and second detectors 12 and 13 are applied to the light quantity calculating means 102, where the light quantity upon the wafer W surface is calculated. Here, if gS1≠fS2, it is concluded that the transmissivity of the illumination optical system 100 and the projection optical system 10 has varied from the moment of adjustment using the absolute illuminomitor, in the initial setting. Thus, from the results, the calculating means 102 calculates a sensitivity correction value. If the output signals here are $S1_1$ and $S2_1$, the ratio of light quantity upon the wafer W surface as can be calculated from these output signals, that is, $\epsilon=fS2_1/gS1_1$, corresponds to the change in transmissivity. This $\epsilon$ is taken as a sensitivity correction coefficient for the first step, and it is stored into the calculating means 102.

Subsequently, while keeping the reticle R loaded on the reticle stage 9, the second detector 13 is moved into the exposure region of the projection optical system 10, and the light source 1 is caused to emit a pulse of light of a predetermined number, with predetermined energy. In response, output signals $S1_2$ and $S2_2$ of the first and second detectors 12 and 13 are measured. Here, the ratio $fS2_2/gS1_2$ of light quantity on the wafer W as calculated from these output signals is taken as an initial value $D_0$ of the second step, and it is stored into the calculating means 102. During actual exposure processes to be executed subsequently, the light quantity E on the wafer W surface as can be predicted from the output signal S1 of the first detector 12 is $E=\epsilon \times gS1$.

When the exposures of wafers of a number N are completed, the second detector 13 is moved back to the predetermined position, and sensitivity correction at the second step is executed. Then, if the output signal is $S2_3$ and the signal output of the first detector 12 is $S1_3$, the ratio $D=fS2_3/gS1_3$ is calculated. Then, while taking the ratio between D and memorized $D_0$ in the calculating means 102, $\zeta=D/D_0$ is calculated. Here, $\zeta$ corresponds to transmissivity change of the illumination optical system 100 and the projection optical system 10 occurring in the period from start of exposure to the end of the predetermined exposure. This $\zeta$ is taken as a sensitivity correction coefficient for the second step, and it is stored into the calculating means 102. In the exposure processes following the sensitivity correction at the second step, the light quantity E as can be predicted from the output signal S1 of the first detector 12 is $E=\epsilon \times \zeta \times gS1$. Here, "$\epsilon \times \zeta \times g$" is the gain to the output signal S1 as newly determined through the sensitivity correction at the second step. Correct measurement of the light quantity on the wafer W surface and exposure process with correct exposure amount, are thus enabled.

If the size of the light receiving surface of the second detector 13 is smaller than the exposure range of the circuit pattern of the reticle R, the wafer stage 11 may be step-moved within a range of projection of the circuit pattern of the reticle R and output signals of the second detector 13 corresponding to sequential positions of the detector 13 may be measured. Then, the coordinates of such position whereat the output is highest may be memorized. In the second step, the reticle R may be moved to that position, and sensitivity correction may be performed.

In the present embodiment, the relation between the voltage applied to the light source 1 and the output signal of the first detector 12 is detected beforehand. During the exposure process, the control system 103 adjusts the set voltage so that the output signal of the detector 12 reaches a level set in consideration of the sensitivity correction coefficient, whereby the light quantity is controlled. Also, the energy of pulses from the light source 1 involves dispersion. Therefore, from a difference between a target value and an actually measured value, per pulse, as detected through the first detector 12, a subsequent target value for light quantity may be changed from the initially set level. On the basis of the thus changed target value, the control system 103 may change the set voltage for the light source 1.

It is an alternative method that emission of the light source 1 is discontinued at the moment whereat the total of light quantity per one shot exceeds a predetermined value. Also, there may be a method in which only the light quantity of the last pulse is adjusted to assure an integrated exposure amount equal to a set value.

While in this embodiment a description has been given with reference to a step-and-repeat type projection exposure apparatus (stepper), substantially the same advantageous effects are attainable when the invention is applied to an exposure apparatus of a contact type or a proximity type or to a step-and-scan type projection exposure apparatus.

Next, an embodiment of a semiconductor device manufacturing method, which uses an exposure apparatus according to any of the above-described embodiments, will be explained.

Figure 10:
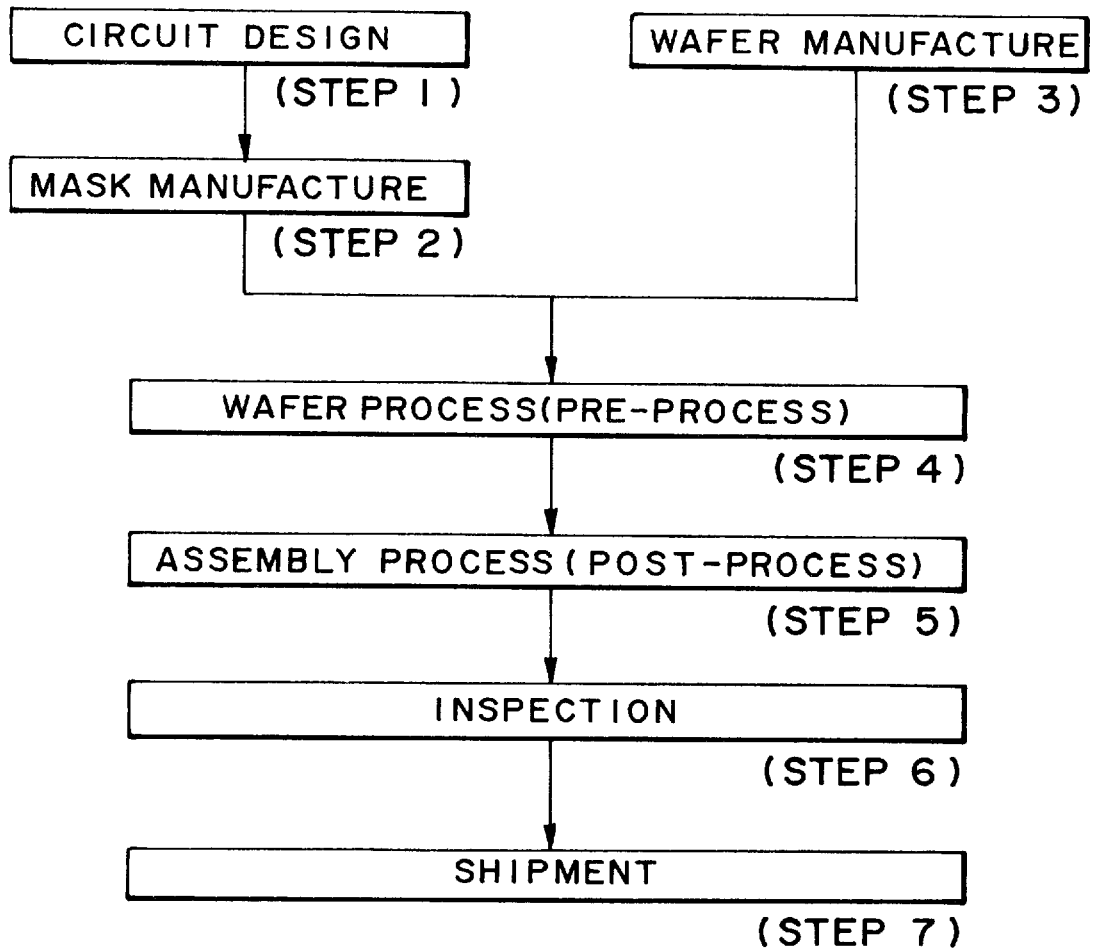
FIG. 10 is a flow chart for explaining semiconductor device manufacturing processes.

FIG. 10 is a flow chart of the sequence of manufacturing a semiconductor device, such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 11:
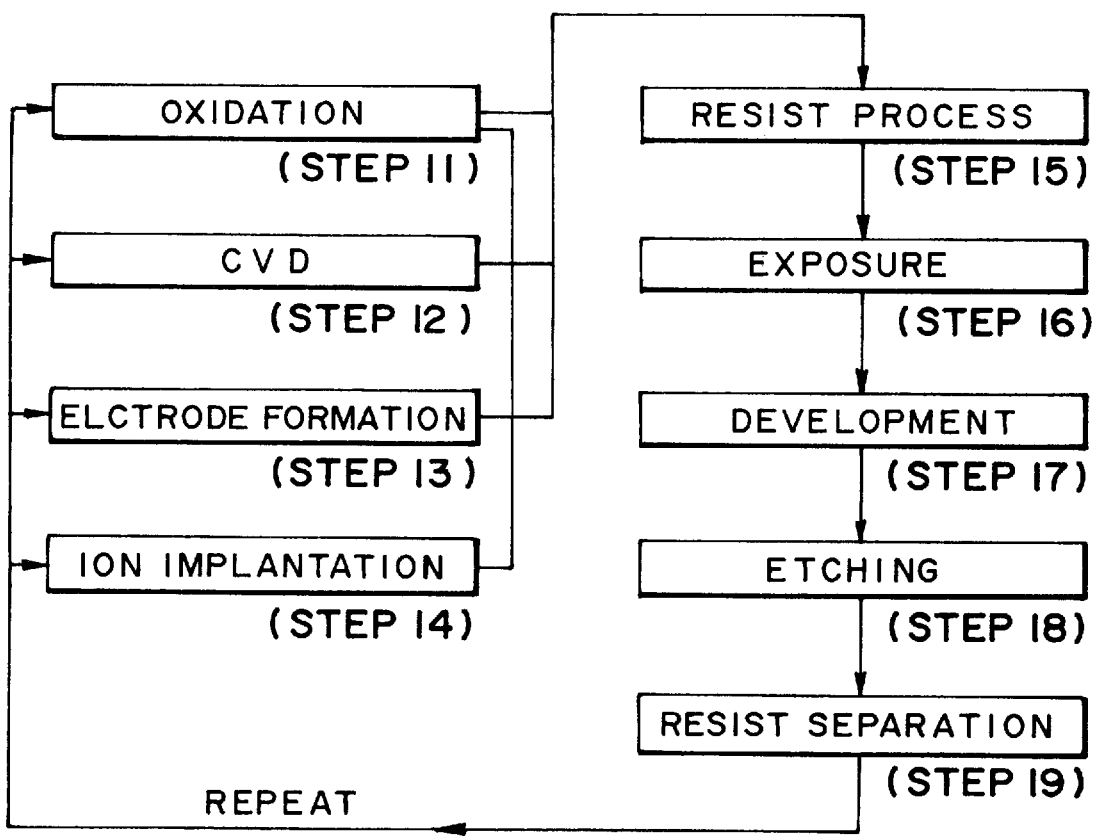
FIG. 11 is a flow chart for explaining the details of a wafer process, among FIG. 10 processes.

FIG. 11 is a flow chart showing the details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   an illumination optical system;
   first light receiving means for receiving a portion of exposure light from said illumination optical system;
   a movable reticle stage having a transmitting portion, defined at a position other than a location where the reticle is to be placed, for transmitting exposure light; and
   second light receiving means for receiving the exposure light transmitted through said transmitting portion.

2. An apparatus according to claim 1, further comprising a projection optical system, wherein said second light receiving means receives the exposure light having passed through at least a portion of said projection optical system.

3. An apparatus according to claim 1, further comprising a movable wafer stage, wherein said second light receiving means is provided on said wafer stage and has a light receiving surface disposed at a position optically conjugate with a wafer.

4. An apparatus according to claim 1, further comprising storing means for storing correction information related to correction of the sensitivity of said first light receiving means based on detection through said first and second light receiving means.

5. An apparatus according to claim 4, wherein the correction information is based on a ratio between detected values of said first and second light receiving means.

6. An apparatus according to claim 1, wherein said exposure apparatus is a scanning exposure apparatus for performing an exposure process while scanning a reticle and a wafer.

7. An apparatus according to claim 1, further comprising an excimer laser for providing exposure light.

8. An exposure method for use with an exposure apparatus having an illumination optical system, first light receiving means for receiving a portion of exposure light from the illumination optical system, a projection optical system, and second light receiving means for receiving exposure light transmitted through at least a portion of the projection optical system, wherein a reticle is illuminated with the illumination optical system so that a pattern of the reticle is transferred to a wafer, said method comprising the steps of:

detecting a first ratio between detected values of the first and second light receiving means in a state in which the reticle is not disposed on a path of exposure light, and a second ratio between detected values of the first and second light receiving means in a state in which the reticle is disposed on the path of exposure light;

detecting a third ratio between detected values of the first and second light receiving means in a state, after at least one exposure processes, the reticle is disposed on the path of exposure light; and correcting a sensitivity of the first light receiving means on the basis of the first, second and third ratios.

9. A method according to claim 8, wherein a detected value of the first light receiving means is detected on a plane optically conjugate with the reticle.

10. A method according to claim 8, wherein the exposure light comprises excimer laser light.

11. An exposure apparatus, comprising:

an illumination optical system;

first light receiving means for receiving a portion of exposure light from the illumination optical system;

a projection optical system;

second light receiving means for receiving exposure light transmitted through at least a portion of the projection optical system;

correcting means for correcting a sensitivity of a detected value of said first light receiving means, said correcting means is serviceable (i) to detect a first ratio between detected values of the first and second light receiving means in a state in which the reticle is not disposed on a path of exposure light, (ii) to detect a second ratio between detected values of the first and second light receiving means in a state in which the reticle is disposed on the path of exposure light, (iii) to detect a third ratio between detected values of the first and second light receiving means in a state, after at least one exposure processes, the reticle is disposed on the path of exposure light, and (iv) to correct a sensitivity of the first light receiving means on the basis of the first, second and third ratios.

12. An apparatus according to claim 11, further comprising a first reflection surface having a first reflectivity and a second reflection surface having a second reflectivity different from the first reflectivity, wherein the first and second reflection surfaces are disposed substantially at the same level as a surface of a wafer to be exposed, and wherein said second light receiving means receives exposure light reflected by the first and second reflection surfaces.

13. An apparatus according to claim 11, wherein said second light receiving means has a light receiving surface disposed substantially at the same level as a surface of a wafer to be exposed.

14. A device manufacturing method including transferring a pattern of a reticle onto a wafer, said method comprising the steps of:

detecting a light quantity of a portion of exposure light from an illumination optical system, by use of first light detecting means;

detecting, by use of second light receiving means, a light quantity of exposure light passed through a transmitting portion of a movable reticle stage defined at a position thereon other than a location where the reticle is to be placed; and correcting a sensitivity of the first light detecting means, on the basis of detected values of the first and second light receiving means.

15. A method according to claim 14, wherein the second light receiving means receives exposure light passed through at least a portion of a projection optical system.

16. A method according to claim 14, wherein the second light receiving means is provided on a wafer stage and has a light receiving surface disposed at a position optically conjugate with the wafer.

17. A method according to claim 14, wherein the sensitivity of the first light receiving means is corrected on the basis of a ratio between the detected values of the first and second light receiving means.

18. A method according to claim 14, further comprising performing an exposure process while scanning the reticle and the wafer.

19. A method according to claim 14, wherein the exposure light comprises excimer laser light.

20. A device manufacturing method for use with an exposure apparatus having an illumination optical system, first light receiving means for receiving a portion of exposure light from the illumination optical system, a projection optical system, and second light receiving means for receiving exposure light transmitted through at least a portion of the projection optical system, wherein a reticle is illuminated with the illumination optical system so that a pattern of the reticle is transferred to a wafer, said method comprising the steps of:

detecting a first ratio between detected values of the first and second light receiving means in a state in which the reticle is not disposed on a path of exposure light, and a second ratio between detected values of the first and second light receiving means in a state in which the reticle is disposed on the path of exposure light;

detecting a third ratio between detected values of the first and second light receiving means in a state, after at least one exposure processes, the reticle is disposed on the path of exposure light; and correcting a sensitivity of the first light receiving means on the basis of the first, second and third ratios.

21. A method according to claim 20 wherein a detected value of the first light receiving means is detected on a plane optically conjugate with the reticle.

22. A method according to claim 20, wherein the exposure light comprises excimer laser light.

* * * * *

UNITED STATES PATENT AND TRADEMARK OFFICE
CERTIFICATE OF CORRECTION

PATENT NO.  : 5,892,573

DATED       : April 6, 1999

INVENTORS   : KAZUHIRO TAKAHASHI, ET AL.

It is certified that error appears in the above-identified patent and that said Letters Patent is hereby corrected as shown below:

IN THE DRAWINGS:

In Figure 7A, "PREDETERMIND" should read --PREDETERMINED-- and "REFLECT ION" should read --REFLECTION-- (both occurrences).

Figure 7B:
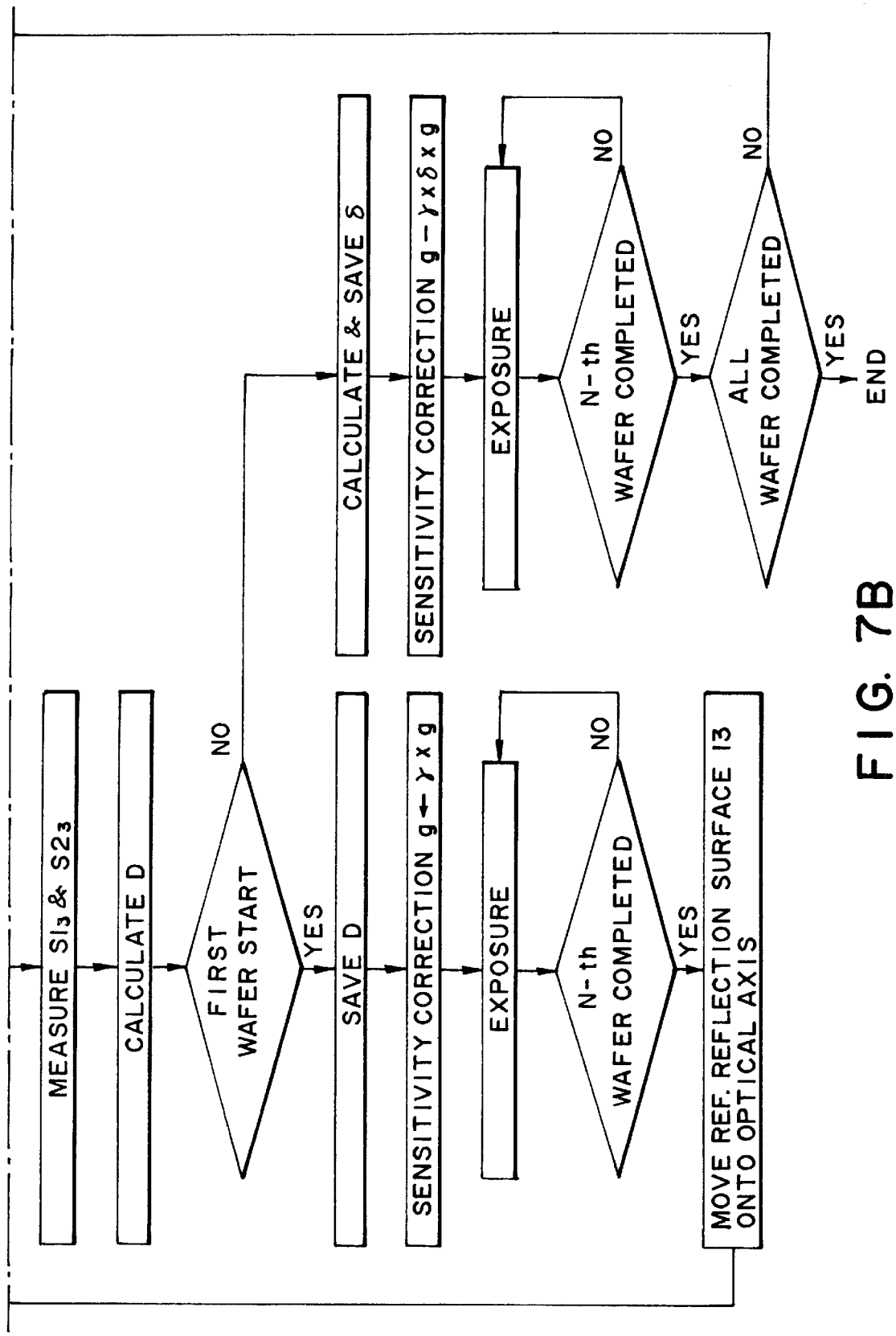
FIG. 7 is a block diagram explaining the relationship between FIGS. 7A and 7B, FIGS. 7A and 7B being flow charts for explaining the sensitivity correcting process in the exposure apparatus of the FIG. 6 embodiment.

In Figure 7B, "CALCULATE D" should read --CALCULATED-- and "SAVE D" should read --SAVED--.

In Figure 9A, "PREDETERMIND" should read --PREDETERMINED--.

Figure 9B:
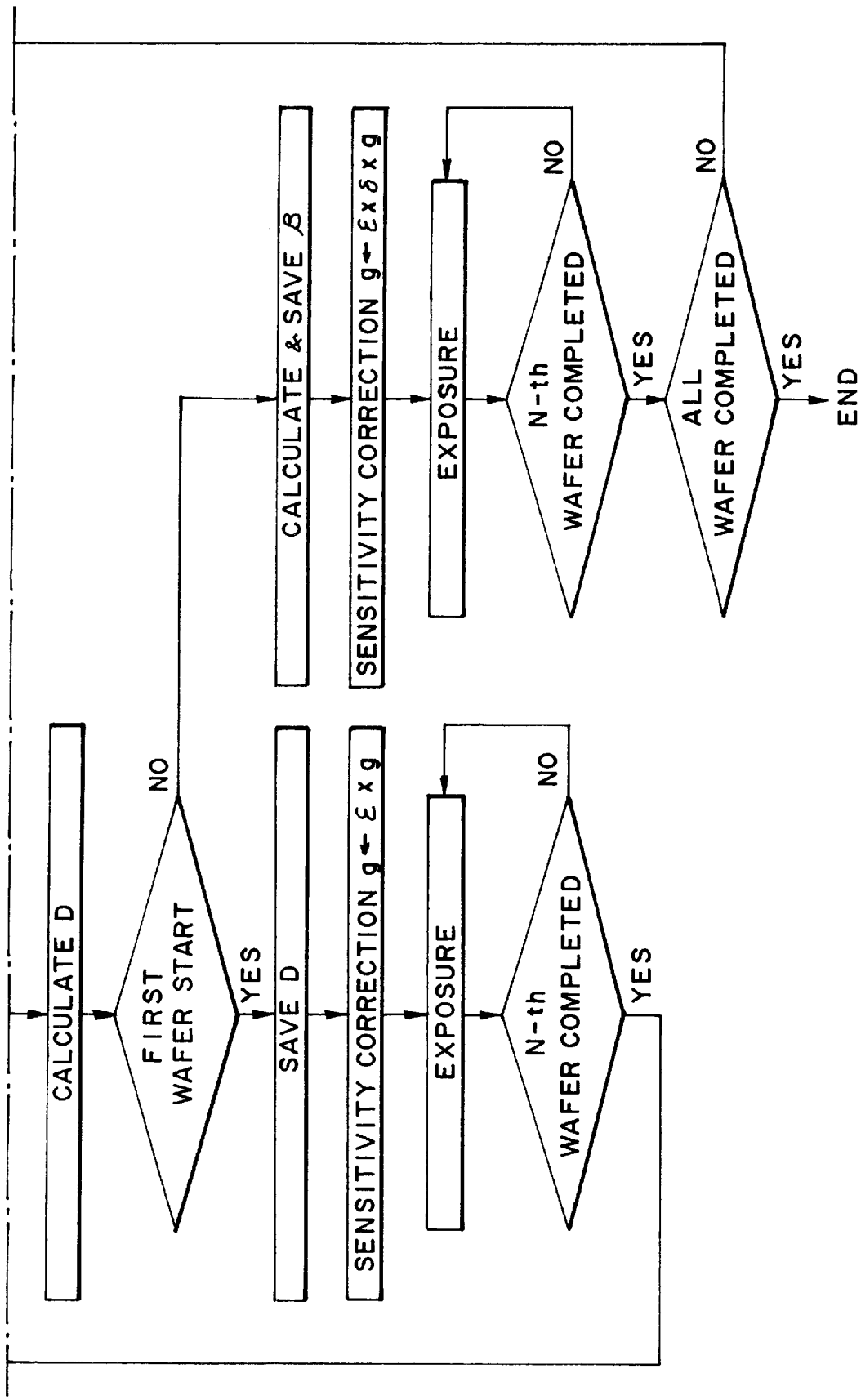
FIG. 9 is a block diagram explaining the relationship between FIGS. 9A and 9B, FIGS. 9A and 9B being flow charts for explaining sensitivity correcting process in the exposure apparatus of the FIG. 8 embodiment.

In Figure 9B, "CALCULATE D" should read --CALCULATED-- and "SAVE D" should read --SAVED--.

IN THE DISCLOSURE:

COLUMN 3:

line 52, "explaining" should read --explaining the--.

COLUMN 9:

line 33, "are" should be deleted.

UNITED STATES PATENT AND TRADEMARK OFFICE
CERTIFICATE OF CORRECTION

PATENT NO. : 5,892,573

DATED : April 6, 1999

INVENTORS : KAZUHIRO TAKAHASHI, ET AL.        Page 2 of 2

It is certified that error appears in the above-identified patent and that said Letters Patent is hereby corrected as shown below:

COLUMN 10:

line 28, "$gs1_1=fS2_{()} (S2_{()}$" should read --$gS1_1=fS2_0 (S2_0$--.

COLUMN 11:

line 18, "calculation" should read --the calculation--.

COLUMN 15:

line 58, "processes," should read --process,--.

COLUMN 16:

line 56, "processes," should read --process,--.

Signed and Sealed this

Twenty-sixth Day of October, 1999

Attest:

Q. TODD DICKINSON

*Attesting Officer*        *Acting Commissioner of Patents and Trademarks*